United States Patent
Kwon et al.

(10) Patent No.: US 10,445,440 B2
(45) Date of Patent: Oct. 15, 2019

(54) SIMULATION METHOD AND SYSTEM FOR REAL-TIME BROADCASTING

(71) Applicants: NHN Entertainment Corporation, Seongnam-si (KR); NHN BlackPick Corporation, Seongnam-si (KR)

(72) Inventors: Hyeok Jun Kwon, Seongnam-si (KR); Chan Jong Lee, Seongnam-si (KR); Kieran Kyunghoon Park, Seongnam-si (KR); Chul Byung Chae, Seongnam-si (KR); Jong Woon Park, Seongnam-si (KR)

(73) Assignees: NHN Corporation, Seongnam-si (KR); NHN BlackPick Corporation, Seongnam-si (KR)

( * ) Notice: Subject to any disclaimer, the term of this patent is extended or adjusted under 35 U.S.C. 154(b) by 1178 days.

(21) Appl. No.: 14/285,256

(22) Filed: May 22, 2014

(65) Prior Publication Data

US 2015/0019186 A1    Jan. 15, 2015

(30) Foreign Application Priority Data

Jul. 9, 2013    (KR) .................. 10-2013-0080178
Jul. 9, 2013    (KR) .................. 10-2013-0080179

(51) Int. Cl.
*G06F 17/50*    (2006.01)
*A63F 13/40*    (2014.01)
(Continued)

(52) U.S. Cl.
CPC .......... *G06F 17/5009* (2013.01); *A63F 13/10* (2013.01); *A63F 13/12* (2013.01);
(Continued)

(58) Field of Classification Search
CPC ...... G06F 17/5009; A63F 13/30; A63F 13/40; A63F 13/828; A63F 13/10; A63F 13/12
See application file for complete search history.

(56) References Cited

U.S. PATENT DOCUMENTS

| 5,954,581 A | 9/1999 | Ohta et al. |
| 6,280,323 B1 * | 8/2001 | Yamazaki ............. A63F 13/005 463/31 |

(Continued)

FOREIGN PATENT DOCUMENTS

| EP | 1092458 | 4/2001 |
| JP | H09-164274 | 6/1997 |

(Continued)

OTHER PUBLICATIONS

Metaboli unilimited gaming, "Championship Manager 2007", Oct. 13, 2006, 5 pages, accessed at http://www.metaboli.co.uk/download-video-games/pc-games-Champ-Manager-07-11049999-16.html.*

(Continued)

*Primary Examiner* — Aniss Chad
*Assistant Examiner* — Justin C Mikowski
(74) *Attorney, Agent, or Firm* — H.C. Park & Associates, PLC

(57) ABSTRACT

Provided is a simulation method and system for real-time broadcasting. A simulation method may include verifying an action set for a mechanical object, and displaying a movement of the mechanical object in response to the action using a line that connects a start location of the movement and an end location of the movement.

19 Claims, 9 Drawing Sheets

(51) Int. Cl.
A63F 13/30 (2014.01)
A63F 13/828 (2014.01)

(52) U.S. Cl.
CPC .............. *A63F 13/30* (2014.09); *A63F 13/40* (2014.09); *A63F 13/828* (2014.09)

(56) References Cited

U.S. PATENT DOCUMENTS

| | | | | |
|---|---|---|---|---|
| 7,044,856 | B2* | 5/2006 | Suzuki | A63F 13/10 463/31 |
| 7,474,698 | B2* | 1/2009 | Pan | G11B 27/031 375/240.08 |
| 7,657,836 | B2* | 2/2010 | Pan | G06K 9/00711 715/723 |
| 8,279,051 | B2* | 10/2012 | Khan | A63B 24/0021 340/323 R |
| 8,606,090 | B2* | 12/2013 | Eyer | H04N 5/783 386/350 |
| 8,702,504 | B1* | 4/2014 | Hughes | G06F 3/04842 463/31 |
| 9,283,457 | B2* | 3/2016 | Thurman | A63B 69/002 |
| 9,839,853 | B2* | 12/2017 | Lee | A63F 13/828 |
| 9,965,129 | B2* | 5/2018 | Reiley | G06F 3/048 |
| 2009/0029754 | A1* | 1/2009 | Slocum | A63B 24/0087 463/5 |
| 2011/0087515 | A1* | 4/2011 | Miller | G06Q 10/04 705/7.26 |
| 2012/0295677 | A1* | 11/2012 | Ok | A63B 24/0021 463/2 |
| 2013/0053989 | A1 | 2/2013 | Miller | |

FOREIGN PATENT DOCUMENTS

| | | |
|---|---|---|
| JP | 11-306391 | 11/1999 |
| JP | 2001-347074 | 12/2001 |
| JP | 2003-103059 | 4/2003 |
| JP | 2003-199060 | 7/2003 |
| JP | 2003-308540 | 10/2003 |
| JP | 2003-340150 | 12/2003 |
| JP | 2004-208894 | 7/2004 |
| JP | 2004-283249 | 10/2004 |
| JP | 2005-131310 | 5/2005 |
| JP | 2010-263951 | 11/2010 |
| JP | 2011-212266 | 10/2011 |
| KR | 1020020087840 | 11/2002 |
| WO | 2009/015500 | 2/2009 |
| WO | WO 2009015500 A1 * | 2/2009 .............. A63F 13/10 |
| WO | 2010/035106 | 4/2010 |

OTHER PUBLICATIONS

Eidos, Championship Manager 2007 User Manual, Oct. 13, 2006, 21 pages.*
Stack Overflow, "How the dynamics of a sports simulation game works?", Jul. 28, 2009, 3 pages, Accessible at https://stackoverflow.com/questions/1192147/how-the-dynamics-of-a-sports-simulation-works.*
Elisabeth Andrè, et. al., Three RoboCup Simulation League Commentator Systems, AI Magazine, vol. 21, No. 1, pp. 57-66 (2000) (Year: 2000).*
Dan Fu, et. al., Evaluating Game Technologies for Training, IEEEAC paper #1203, Version 9, Updated Jan. 16, 2008, pp. 1-10. (Year: 2008).*
Joschka Boedecker et. al., SimSpark—Concepts and Application in the RoboCup 3D Soccer Simulation League, Workshop Proceedings of SIMPAR 2008, Intl. Conf. on Simulation, Modeling and Programming for Autonomous Robots, Venice(Italy) Nov. 3-4, 2008, pp. 174-181 (Year: 2008).*
Wiruj Suwanpramote, et. al., Imitative Attacking AI for Soccer Games, 2012 4th International Conference on Computer Engineering and Technology (ICCET 2012), p. 123-126. (Year: 2012).*
Ubbo Visser, TopLeague and Bundesliga Manager: New Generation Online Soccer Games, J. Ruiz-del-Solar, E. Chown, and P.G. Ploeger (Eds.): RoboCup 2010, LNAI 6556, pp. 230-241, 2011. (Year: 2011).*
JingSin Liu, TzuChen Liang and YiAn Lin (2004). Realization of a ball passing strategy for a robot soccer game: a case study of integrated planning and control. Robotica, 22, pp. 329-338. (Year: 2004).*
Extended European Search Report dated Nov. 6, 2014, in European Patent Application No. 14176079.3.
Japanese Office Action dated Apr. 28, 2015, in Japanese Patent Application No. 2014-105597.
Office Action dated Oct. 4, 2016, in Japanese Patent Application No. 2015-147631.
Office Action dated Jun. 12, 2017, in Chinese Patent Application No. 201410228312.8.

* cited by examiner

FIG. 8

| | NAME | POSITION | LEVEL | CONDITION | STRENGTH | AVERAGE | SCORES | ASSIST |
|---|---|---|---|---|---|---|---|---|
| 800 | AAAA | LW | 1 | △ | 4% | 0 | 0 | 0 |
| | BBBB | LB | 1 | ▽ | 4% | 0 | 0 | 0 |
| | CCCC | CB | 1 | △ | 1% | 0 | 0 | 0 |
| | DDDD | CM | 1 | △ | 5% | 0 | 0 | 0 |
| | EEEE | GK | 1 | △ | 1% | 0 | 0 | 0 |
| | FFFF | ST | 1 | △ | 1% | 0 | 0 | 0 |
| | GGGG | CDM | 1 | ▽ | 3% | 0 | 0 | 0 |
| | HHHH | CB | 1 | △ | 4% | 0 | 0 | 0 |
| | IIII | CM | 1 | △ | 5% | 0 | 0 | 0 |
| | JJJJ | RB | 1 | △ | 1% | 0 | 0 | 0 |
| | KKKK | RW | 1 | △ | 5% | 0 | 0 | 0 |

810 — [ PLAYER SUBSTITUTION ] [ STRATEGY INSTRUCTION ] [ FORMATION 4-4-2 ]

| NAME | LEVEL | CONDITION | STRENGTH | AVERAGE | SCORES | ASSIST |
|---|---|---|---|---|---|---|
| LLLL | 1 | △ | 4% | 0 | 0 | 0 |
| MMMM | 1 | △ | 4% | 0 | 0 | 0 |
| NNNN | 1 | △ | 3% | 0 | 0 | 0 |
| OOOO | 1 | △ | 5% | 0 | 0 | 0 |

SIMULATION METHOD AND SYSTEM FOR REAL-TIME BROADCASTING

CROSS REFERENCE TO RELATED APPLICATIONS

This application claims priority from and the benefit of Korean Patent Application No. 10-2013-0080178, filed on Jul. 9, 2013, and Korean Patent Application No. 10-2013-0080179, filed on Jul. 9, 2013, which are hereby incorporated by reference for all purposes as if fully set forth herein.

BACKGROUND

Field

Exemplary embodiments of the present disclosure relate to a simulation method and system for real-time broadcasting.

Discussion of the Background

In a simulation method and system using communications between a server and a terminal, there is an inconvenience to download a program for a simulation and install the downloaded program in a terminal. In addition, the simulation is allowed only in the terminal in which the program is installed. For example, in a case of simulating a sports game, such as a soccer game, a user may generally simulate the sports game only in a terminal in which a program corresponding to the sports game is installed, and may thus experience constraints. In addition, when a simulation proceeds at predetermined time intervals through association between a plurality of users, a user may experience both temporal and spatial constraints.

The above information disclosed in this Background section is provided to enhance understanding of the background of the disclosed subject matter, and therefore may contain information that does not form any part of the prior art nor what the prior art may suggest to a person of ordinary skill in the art.

SUMMARY

Exemplary embodiments of the present disclosure provide a simulation method and system that may minimize temporal constraints and spatial constraints by providing a web-based simulation and by simplifying a simulation representation.

Exemplary embodiments of the present disclosure also provide a simulation method and system that may simplify a method of providing simulation information by displaying a movement of a mechanical object in response to an action of a character.

Exemplary embodiments of the present disclosure also provide a simulation method and system that may simplify a simulation representation and may also provide a dynamic simulation representation for a highlight scene.

Exemplary embodiments of the present disclosure also provide a simulation method and system that may increase the efficiency of a simulation process by generating and providing, in advance, scene data and result information for the simulation process.

Exemplary embodiments of the present disclosure also provide a simulation method and system that may receive an alteration of terms in the middle of a simulation, may regenerate scene data in response to the alteration of terms, and may apply the altered terms to the simulation.

Additional features of the disclosed subject matter will be set forth in the description which follows, and in part will be apparent from the description, or may be learned by practice of the disclosed subject matter.

Exemplary embodiments of the present disclosure disclose a simulation method. The simulation method includes determining, by a processor, an action set for a mechanical object; and displaying a movement of the mechanical object in response to determining the action, using a line connecting a start location of the movement and an end location of the movement.

Exemplary embodiments of the present disclosure also disclose a simulation system including a transceiver and a processor. The processor is configured to transmit, to a terminal, information about an action set for a mechanical object using the transceiver. The terminal is configured to verify the action and to display a movement of the mechanical object in response to the action using a line connecting a start location of the movement and an end location of the movement.

Exemplary embodiments of the present disclosure also disclose a simulation method. The simulation method includes storing information about probable scenarios in conjunction with a movement of a mechanical object on a simulation, selecting, via a processor, a scenario from the probable scenarios. The method includes providing scene data based on whether motions in the selected scenario have succeeded and transmitting the scene data to a terminal. The scene data includes unit data of an action corresponding to a continuously successful motion among the motions in the selected scenario.

It is to be understood that both the foregoing general description and the following detailed description are exemplary and explanatory and are intended to provide further explanation of the disclosed subject matter as claimed.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter, and together with the description serve to explain the principles of the disclosed subject matter.

FIG. 8 illustrates an example of a user interface according to exemplary embodiments of the present disclosure.

DETAILED DESCRIPTION OF THE ILLUSTRATED EMBODIMENTS

Figure 1:
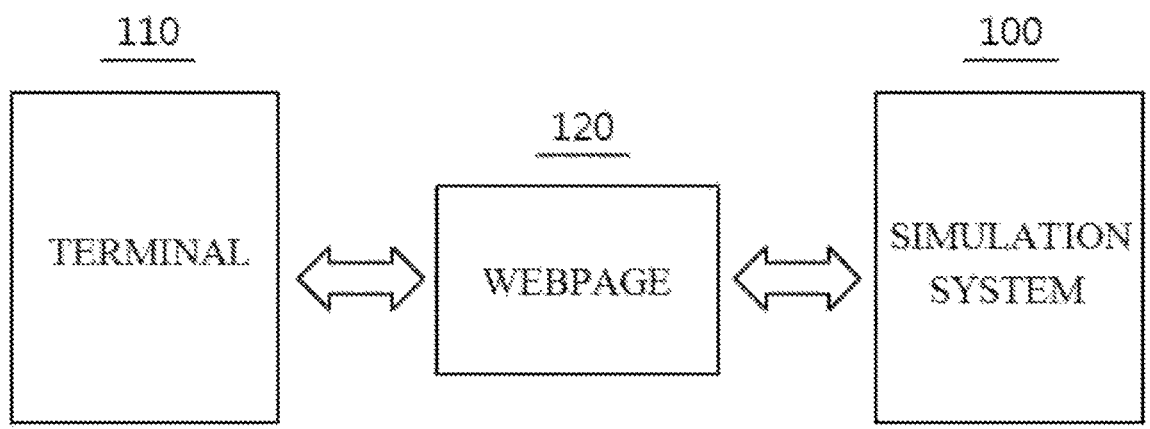
FIG. 1 illustrates a system including a simulation system and a terminal according to exemplary embodiments of the present disclosure.

Exemplary embodiments of the present disclosure will be described in detail with reference to the accompanying drawings. These exemplary embodiments will be described in detail for those skilled in the art in order to practice the disclosed subject matter. It should be appreciated that various exemplary embodiments of the disclosed subject matter may not be exclusive. For example, specific shapes, configurations, and characteristics described in an exemplary embodiment of the disclosed subject matter may be implemented in another exemplary embodiment without departing from the spirit and the scope of the disclosed subject matter. In addition, it should be understood that position and arrangement of individual components in each disclosed exemplary embodiment may be changed without departing from the spirit and the scope of the disclosed subject matter. Therefore, a detailed description described below should not be construed as being restrictive.

In the drawings, the size and relative sizes of layers and regions may be exaggerated for clarity. Like reference numerals in the drawings denote like elements. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. For the purposes of this disclosure, "at least one of X, Y, and Z" can be construed as X only, Y only, Z only, or any combination of two or more items X, Y, and Z (e.g., XYZ, XYY, YZ, ZZ).

The terminology used herein is for the purpose of describing exemplary embodiments and is not intended to be limiting of the disclosed subject matter. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements and/or components, but do not preclude the presence or addition of one or more other features, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

Hereinafter, exemplary embodiments of the disclosed subject matter are described in detail with reference to the accompanying drawings.

FIG. 1 illustrates a system including a simulation system 100 and a terminal 110 according to exemplary embodiments of the present disclosure. Referring to FIG. 1, the system includes the simulation system 100, the terminal 110, and a webpage 120.

The simulation system 100 may refer to a server that is configured to manage users and account information of the users, and to provide simulation data to the terminal 110 connected through the webpage 120. The server may include various combinations of hardware and/or software. For instance, the server may include a memory to store information on users, a processor to process data in the server, and a communication unit to send and receive signals and data to the terminal 110 via webpage 120. The server may execute various functions, not limited to functions for providing a simulation (e.g., game) to terminal 110 via webpage 120.

The terminal 110 may refer to a user device, such as a personal computer (PC), a smart television (TV), and a mobile phone. In general, terminal 110 may be any electronic device capable of connecting to webpage 120 in a wireless or wired manner through a network, such as the Internet. It should therefore be understood that terminal 110 may include various components, such as a memory, a transceiver, a processor, and an input/output unit. Browsers may be installed in the terminal 110 to access webpage 120 provided by the simulation system 100.

A user may access the webpage 120 through the terminal 110, and may customize a variety of settings for a simulation, such as a log-in, a camp selection, a character selection, and a strategy selection. The simulation may be performed at the simulation system 100, and a simulation result may be displayed at the terminal 110 through the webpage 120. For example, the terminal 110 may configure a screen using a HyperText Markup Language (HTML), Cascading Style Sheets (CSS), and/or JavaScript, and may process messaging between the simulation system 100 and the terminal 110 using HTTP-based Ajax, comet, and/or reverse Ajax. In general, various suitable languages and codes may be used to configure the screen and the simulation.

Since the simulation is executed and controlled at the simulation system 100, users may be prevented from abusing the simulation. Although a user may not install a program corresponding to the simulation in the terminal 110, the user may obtain a simulation result corresponding to the simulation. Thus, user inconvenience due to downloading and installing a program may be decreased.

Figure 2:
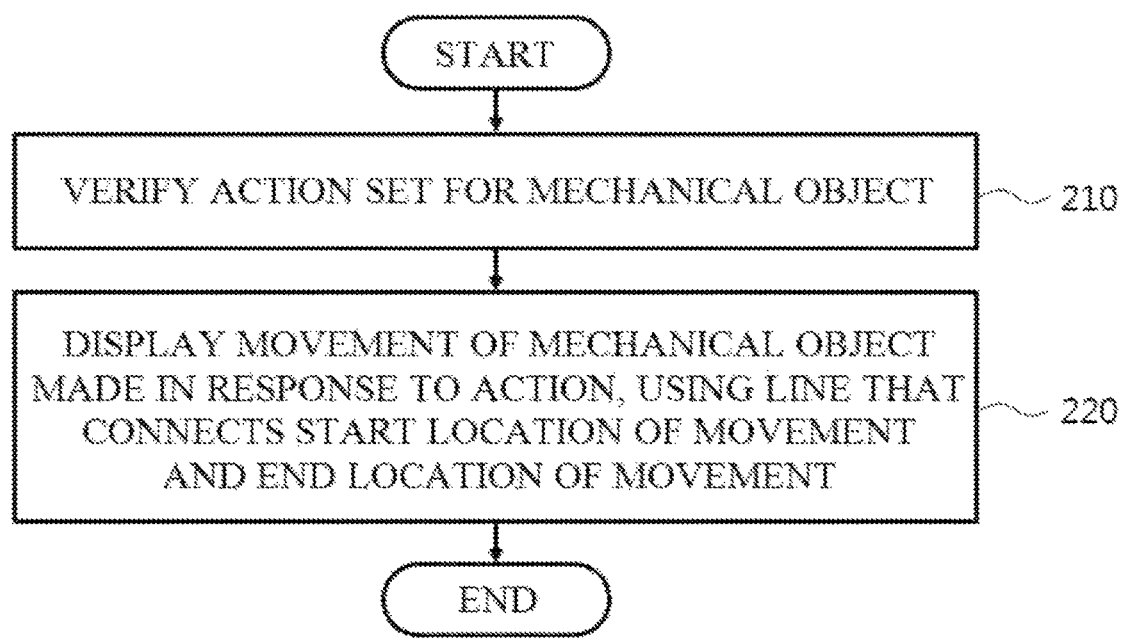
FIG. 2 is a flowchart illustrating a simulation method performed by a terminal according to exemplary embodiments of the present disclosure.

FIG. 2 is a flowchart illustrating a simulation method performed by a terminal according to exemplary embodiments of the present disclosure. The simulation method may be performed by the terminal 110 of FIG. 1. The simulation method may be embodied using a scenario method, and may include determining a motion likely to occur, probabilistically selecting a scenario from a scenario pool, and listing a scenario suitable for a current situation using a basic factor and a control factor to thereby produce a result. Such a scenario method will be further described using a scene. As an example, FIG. 2 is described with reference to a simulation for a movement of a mechanical object Referring to FIG. 2, the terminal 110 may verify an action set for a mechanical object (210). The mechanical object may correspond to a virtual object movable in response to an action of a virtual character in a simulation. For example, the mechanical object may include a ball object. A ball may refer to an exercise tool that may be round, may be made of leather, rubber, or plastic, and may be passed, dribbled, kicked, or rolled. The ball object may be a virtual ball that is represented on the simulation and moved in response to an action of a character.

The terminal 110 may display a movement of the mechanical object in response to the action using a line that connects a start location of the movement and an end location of the movement (220). The action may occur in response to a motion that is triggered by at least one character among a plurality of characters with respect to the mechanical object. For example, the mechanical object may include a ball object, and the motion that is triggered by the at least one character with respect to the mechanical object may include at least one of a pass, dribble, intercept, and shot that are triggered by the at least one character with respect to the ball object. A success of the motion may be determined based on various factors, such as at least one of a location and abilities of each of the plurality of characters, a formation, abilities of camps into which the plurality of characters is grouped, a characteristic for each motion, and a strategy selected by a user.

Figure 3:
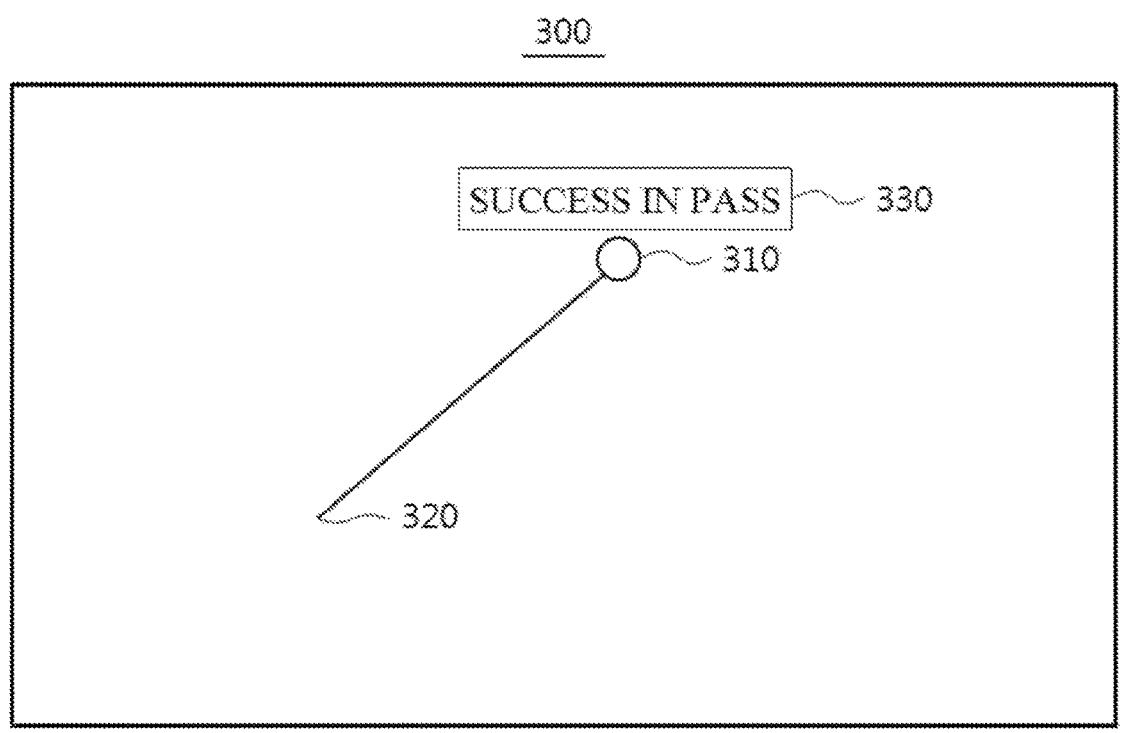
FIG. 3 illustrates an example of a screen displaying a movement of a mechanical object using a line according to exemplary embodiments of the present disclosure.

FIG. 3 illustrates an example of a first screen 300 displaying a movement of a mechanical object 310 by displaying a line according to exemplary embodiments of the present disclosure. The first screen 300 may refer to an example of a screen displaying webpage 120 on a display of the terminal 110. A simulation result in which the mechanical object 310 has moved from a start location 320 to a location indicated on the first screen 300, is shown in FIG. 3. The end location, as described in operation 220, may be a center of the mechanical object 310.

In the case of simulating a soccer game, the mechanical object 310 may be a soccer ball object, and the first screen 300 may show a simulation scene in which an action of a first character passing a soccer ball to a second character has been simulated. Although the characters are not separately displayed, a method of providing simulation information may be simplified by displaying a movement of the mechanical object 310 using a line in response to an action of a character.

In some cases, at least one of identification (ID) information of a character holding the mechanical object 310 and ID information of the action may be further displayed in conjunction with the line or the mechanical object 310. FIG. 3 illustrates an example in which "success in pass" 330 is displayed in conjunction with the mechanical object 310 as the ID information of the action.

According to exemplary embodiments of the present disclosure, at least one of a type and a thickness of the line may be determined based on the action.

Figure 4:
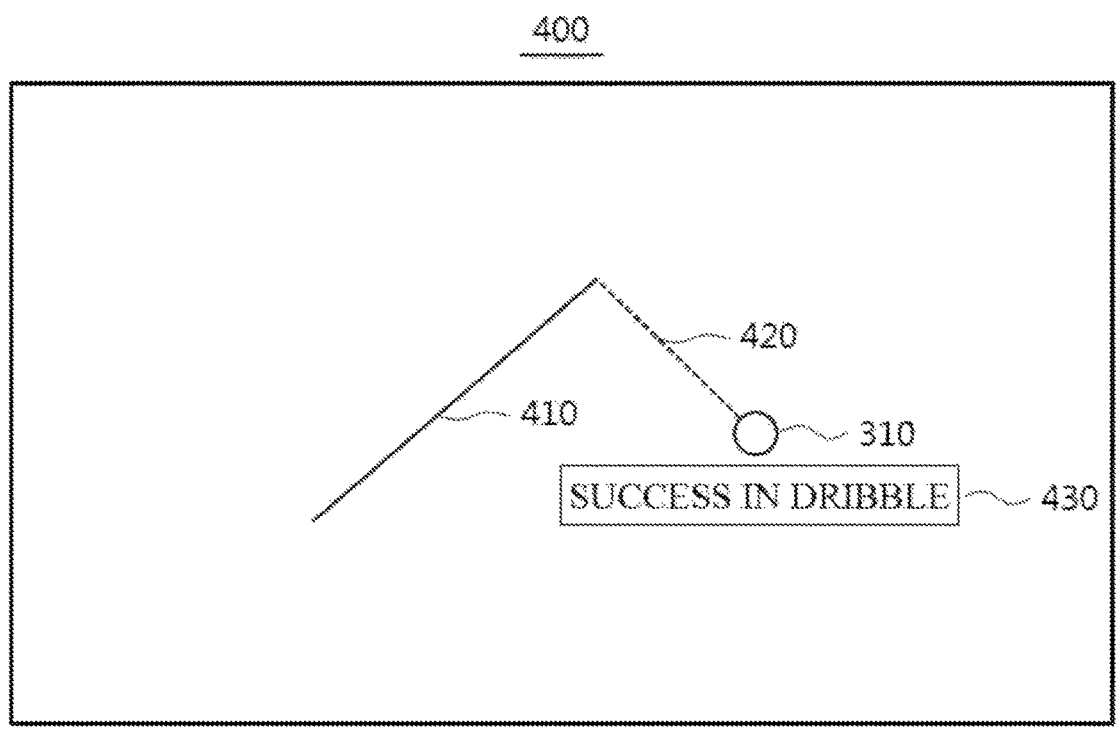
FIG. 4 illustrates an example of a type of line determined based on an action according to exemplary embodiments of the present disclosure.

FIG. 4 illustrates an example of a type of line determined based on an action according to exemplary embodiments of the present disclosure. A second screen 400 shows a scene in which the mechanical object 310 of the first screen 300 has been further moved. To indicate that the additional movement of the mechanical object 310 shown in FIG. 4 has been made in response to an action different from the action shown in FIG. 3, the initial movement is displayed using a solid line 410 and the additional movement is displayed using a dotted line 420.

For example, as described above with reference to the example shown in FIG. 3, the sold line 410 may indicate the action of the first character passing the soccer ball to the second character. The dotted line 420 may refer to an action of the second character receiving and then dribbling the soccer ball.

FIG. 4 illustrates an example in which "success in dribble" 430 displayed in conjunction with the mechanical object 310 is the ID information of the action of the second character.

According to exemplary embodiments of the present disclosure, a color of the line may be determined based on a camp of a character in possession of the mechanical object 310.

Figure 5:
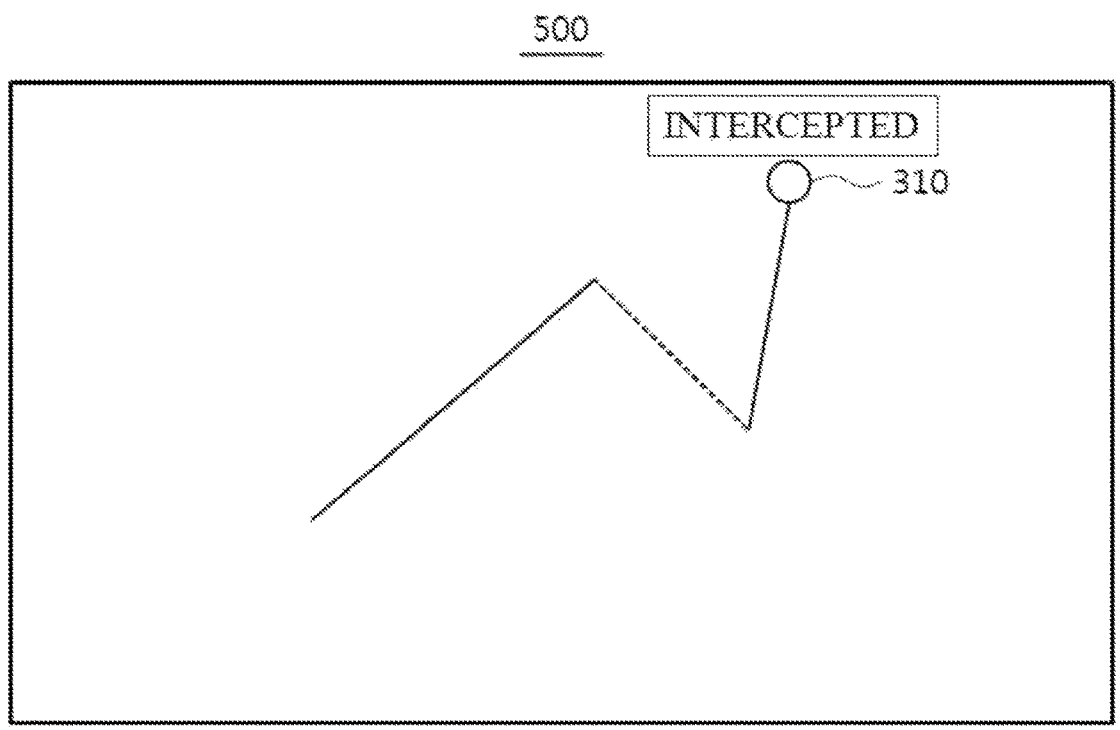
FIG. 5 illustrates an example of displaying a mechanical object movement by characters of a first camp according to exemplary embodiments of the present disclosure.
Figure 6:
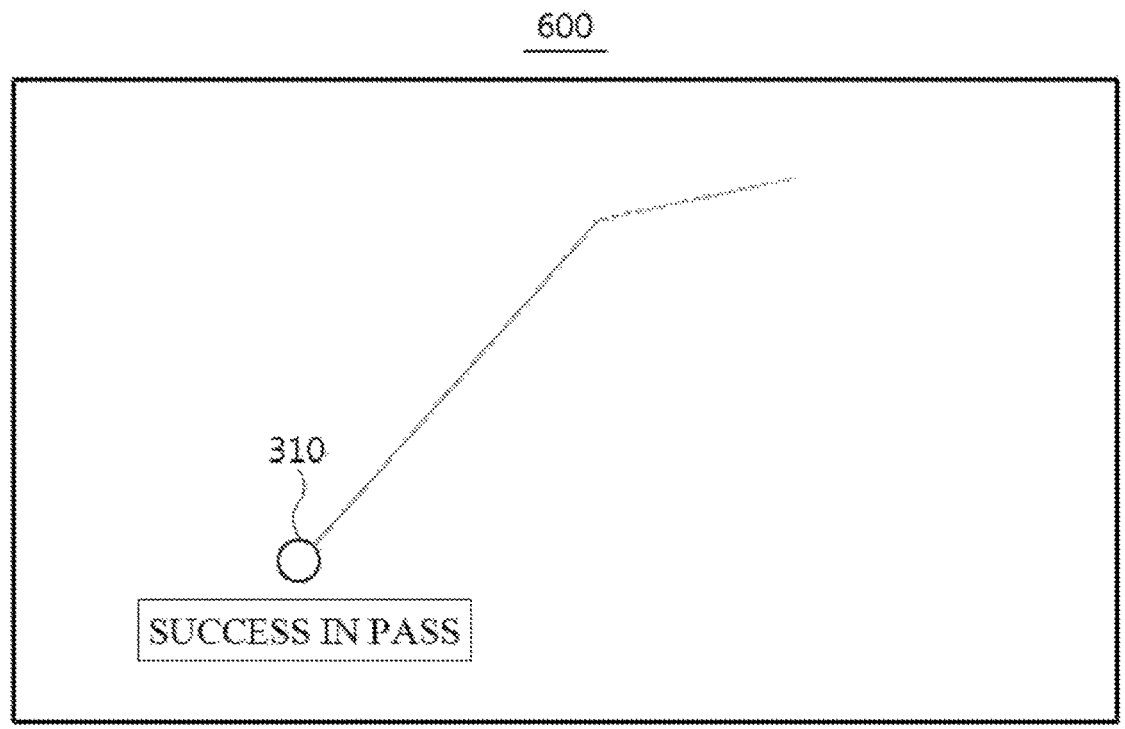
FIG. 6 illustrates an example of displaying a mechanical object movement made by characters of a second camp according to exemplary embodiments of the present disclosure.

FIG. 5 illustrates an example of displaying a movement of the mechanical object 310 by characters of a first camp according to exemplary embodiments of the present disclosure, and FIG. 6 illustrates an example of displaying a movement of the mechanical object 310 by characters of a second camp according to exemplary embodiments of the present disclosure. It should be understood that a camp may refer to any group of the characters such as, for example, a team, organization, or unit.

A third screen 500 shows a scene in which the mechanical object 310 of the second screen 400 has been further moved. For example, the third screen 500 illustrates a simulation result in which the second character of a first camp has dribbled the soccer ball and then attempted to pass the soccer ball. However, the soccer ball has been intercepted by a third character of a second camp, and thus, possession of the mechanical object 310 has been turned over to the second camp.

A fourth screen 600, as shown in FIG. 6, illustrates a scene in which a movement of the mechanical object 310 has been made by a character of the second camp. For example, the fourth screen 600 illustrates a simulation result in which the third character of the second camp has dribbled the intercepted soccer ball and has successfully passed the soccer ball to a fourth character of the second camp. In contrast to the third screen 500, a color of the line may be changed from black to another color, for example, gray, on the fourth screen 600. Accordingly, the color of the line may be determined based on a camp of a character holding the mechanical object 310. In some cases, each camp may be associated with a different or designated line color.

As described above, in a case in which the simulation proceeds through association between characters belonging to a plurality of camps and a movement of a mechanical object 310 is made in response to continuous actions of characters belonging to the same camp, the movement of the mechanical object 310 may be displayed using similar, joined lines in a first color. If possession of the mechanical object 310 is turned over to a character of another camp and thereby the mechanical object 310 is moved, the existing lines may be removed and a subsequent movement of the mechanical object 310 may be displayed again using lines in a color different from the first color.

In some cases, actions continuously occurring due to characters of the same camp may be represented as a single scene.

Referring back to FIG. 2, although not illustrated, verifying an action set for the mechanical object 310 (210) may include receiving, from a simulation system 100, scene data including at least one set of unit data, and verifying an action included in the at least one set of unit data. These operations may be performed by the terminal 110.

The unit data may include information about an action occurring due to one of a plurality of characters grouped in one of a plurality of camps, an action occurring between two characters grouped in the same camp, or an action occurring between two characters grouped in different camps. For example, in the case of simulating a soccer game, the action occurring due to one character may include an action such as "dribbling" or "shooting". The action occurring between two characters grouped in the same camp may include "passing". The action occurring between two characters grouped in different camps may include an "interception" or a "goalkeeper's block".

Scene data may include unit data of at least one action continuously occurring due to characters grouped in the same camp and information about actions included in a single scene. For example, on the third screen 500 of FIG. 5, three actions including "success in pass", "success in dribble", and "intercepted" may compose a single scene.

The simulation system 100 may provide data to the terminal 110 based on a unit of scene data. The terminal 110 may display lines based on a unit of an action, using unit data included in scene data. To enhance the system efficiency, the simulation system 100 may generate, in advance, scene data for an entire simulation prior to providing a simulation result, and may provide the scene data to the terminal 110 through the webpage 120 based on a unit of scene data.

According to exemplary embodiments of the present disclosure, the simulation method of FIG. 2 may include determining whether a highlight scene has occurred, based on a probability set for a type of scene data. For example, the simulation method may determine whether a highlight scene has occurred based on a probability set for each scene including a plurality of actions. For example, in displaying the movement in (220) of FIG. 2, the terminal 110 may display a movement of character objects for a plurality of characters and a movement of the mechanical object 310, instead of using a line, when a highlight scene is determined to occur. As an example, if the simulation is of a soccer game, the highlight scene may occur at the probability of 100% for a successful goal scene, at the probability of 50% for an unsuccessful goal scene, and at the probability of 50% for an offside scene. A single highlight scene may be probabilistically selected from among highlight scenes closest to a situation in the simulation. The selection may be made using a set of control variables for each highlight scene in a pool configured through an exclusive editor. The simulation system 100 may transfer data associated with the highlight scene to the terminal 110 using a protocol, for example, a JavaScript Object Notification (JSON) format, predetermined between the simulation system 100 and the terminal 110. To display the highlight scene, the terminal 110 may load data transferred through JavaScript (e.g., Javascript eval), to a storage unit, such as a memory, determine a type of unit data to be displayed, and display the type of unit data using a display method suitable for the determined type of unit data.

Figure 7:
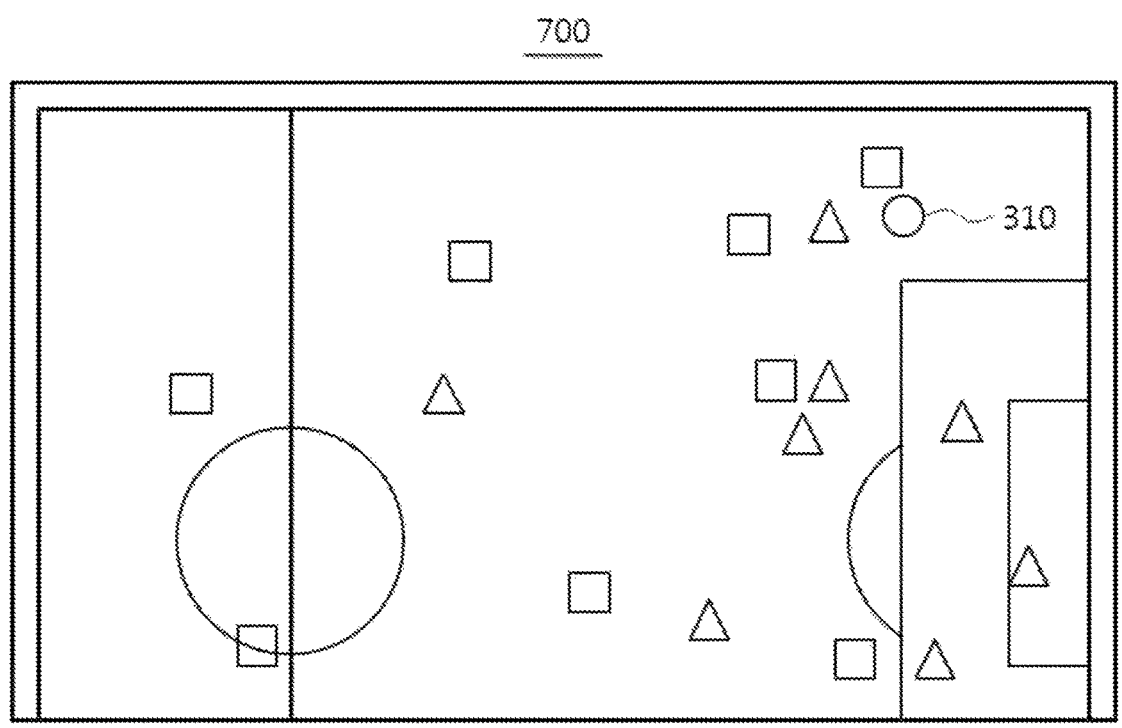
FIG. 7 illustrates an example of a highlight scene according to exemplary embodiments of the present disclosure.

FIG. 7 illustrates an example of a highlight scene according to exemplary embodiments of the present disclosure. FIG. 7 shows a fifth screen 700 as an example of a scene in which character objects corresponding to characters of two camps and a mechanical object 310 are displayed. Characters of a first camp are indicated as rectangular character objects, and characters of a second camp are indicated as triangular character objects. By displaying a movement of the character objects and a movement of the mechanical object 310 instead of displaying a movement of the mechanical object 310 using a line for each action, it is possible to provide a simulation result of actions included in the highlight scene. Therefore, the highlight scene is more dynamic than a normal scene.

A soccer field is displayed as a part of an example of a soccer game simulation on the fifth screen 700. Although only a mechanical object 310 and lines are shown in FIGS. 3, 4, 5, and 6, various additional information may be displayed based on a type of simulation. Further, although only character objects of each camp are displayed, other character objects, such as a referee, may also be displayed if applicable to the simulation.

According to exemplary embodiments of the present disclosure, an action may occur in response to a motion, of which success is determined based on various factors including at least one of a location of each character, abilities of each character, formations of the camps, abilities of each camp, a characteristic for each motion, and a strategy set by a user. For example, the success of a "passing" motion may be determined based on at least one of the aforementioned information. In response to the "passing" motion being successful, a "success in pass" action may occur. In response to the "passing" motion failing, an "intercepted" action, an "end-line out" action, or a "side line out" action may occur.

As an example, a soccer game simulation may use the following factors for simulations.

1. Player (Character)
Statistics of a player
Attack: shooting, goal decisiveness, mid-range shoot
Defense: tackle, team work for defense, man-to-man defense
Speed: main strength, acceleration, quickness
Technique: heading, positioning, individual skill, penalty kick, free kick
Pass: short pass, long pass, cross
Physical: stamina, power, body balance
Goalkeeper: ball handling, reflexes, one-to-one defense, goal kicking capability
Hidden: understanding of strategy, leadership, aggressiveness, ball control, visual field, non-stop shoot, standing tackle, long throw-in, dribble speed, presence of mind 2. Team
Team strategy
Substitution strategy: sets a player substitution strategy based on circumstances.
Operation strategy: sets a direction of attack, strength of tackle, a mid-range shoot, a pass type, and balance between attack and defense.
Strategy card: sets an advantage card enforced in a specific circumstance during a game.
Player designation: sets a captain, a free kicker, a corner kicker, a throw-inner, and a penalty kicker.
Team formation
Team color: team advantage selectable based on chemistry between players
Team chemistry: chemistry between players 3. User Interception
Substitution/switch of players
Instructing an operation strategy
Successes in the soccer game simulation may be achieved as shown in the following examples.

1. "Passing" motion: A success of the "passing" motion is probabilistically determined by comparing between an absolute values of integrated abilities of each camp and/or between a relative values of integrated abilities of each camp and/or comparing between individual abilities of an attacker required for a pass and individual abilities of a defender, based on a characteristic of each pass (e.g., a pass type such as a short pass, a long pass, and a cross pass), a region (e.g., an attacking region, a middle region, and a defending region), and/or a strategy (e.g., attack or defense) employed at a pass point.

2. "Dribble" motion: A success of the dribble motion is probabilistically determined by comparing between an absolute values of integrated abilities of each camp and/or between a relative values of integrated abilities of each camp and/or comparing between individual abilities of an attacker required for a dribble and individual abilities of a defender, based on a characteristic of each dribble (e.g., a short dribble, a long dribble), a region (e.g., an attacking region, a middle region, and a defending region), and/or a strategy (e.g., attack or defense) employed at a dribble point.

3. "Shooting" motion: A success of the shooting motion is probabilistically determined by comparing an absolute values of each camp and/or a relative values of each camp with respect to individual abilities of an attacker, individual abilities of a defender, and integrated abilities of each camp required for shooting, based on a characteristic of each shooing (e.g., short shooting, mid-range shooting, and long shooting) and/or a region (e.g., a penalty area, a front area, and a flank area).

According to exemplary embodiments, the webpage 120 may include a user interface for changing at least one of a formation, a strategy, and a character. For example, the terminal 110 may provide a user with the user interface by displaying the webpage 120. The simulation system 100 may regenerate scene data after a change is made, may provide the regenerated scene data to the terminal 110 through the webpage 120, and thereby apply a real-time interaction of the user during a simulation process. In some cases, a user may enter, through user interfaces or the terminal 110, commands for controlling the characters/players and/or the mechanical object 310 in a game. For instance, a user may use an input unit, such as a touch pad, key pad, or microphone, of terminal 110 to enter an input corresponding to a "passing" motion, "dribbling" motion, or "shooting" motion. It should be understood that various other motions may also be performed such as corner kicks, throw-ins, and tackle motions.

FIG. 8 illustrates an example of a user interface 800 according to exemplary embodiments of the present disclosure. The user interface 800 may be displayed on a screen of the terminal 110 together with screens described above with reference to FIGS. 3, 4, 5, 6, and 7. Among team players of a user of the terminal 110 (e.g., characters of a user's camp), key players and substitute players are distinguishably grouped and displayed on the user interface 800. As shown in the dotted-line box 810, the user interface 800 may include functions for player substitution, strategy instruction, and formation change. For example, a player, a strategy, and/or a formation changed by the user may be applied to a simulation from a subsequent shift point in time between attack and defense, for example, from a subsequent scene, which may affect a simulation result (e.g., a result of a game). It should be understood that various suitable functions maybe provided in the dotted-line box 810. For instance, other functions such as buying or selling players in a camp, setting weather conditions, or setting field conditions may also be provided.

Figure 9:
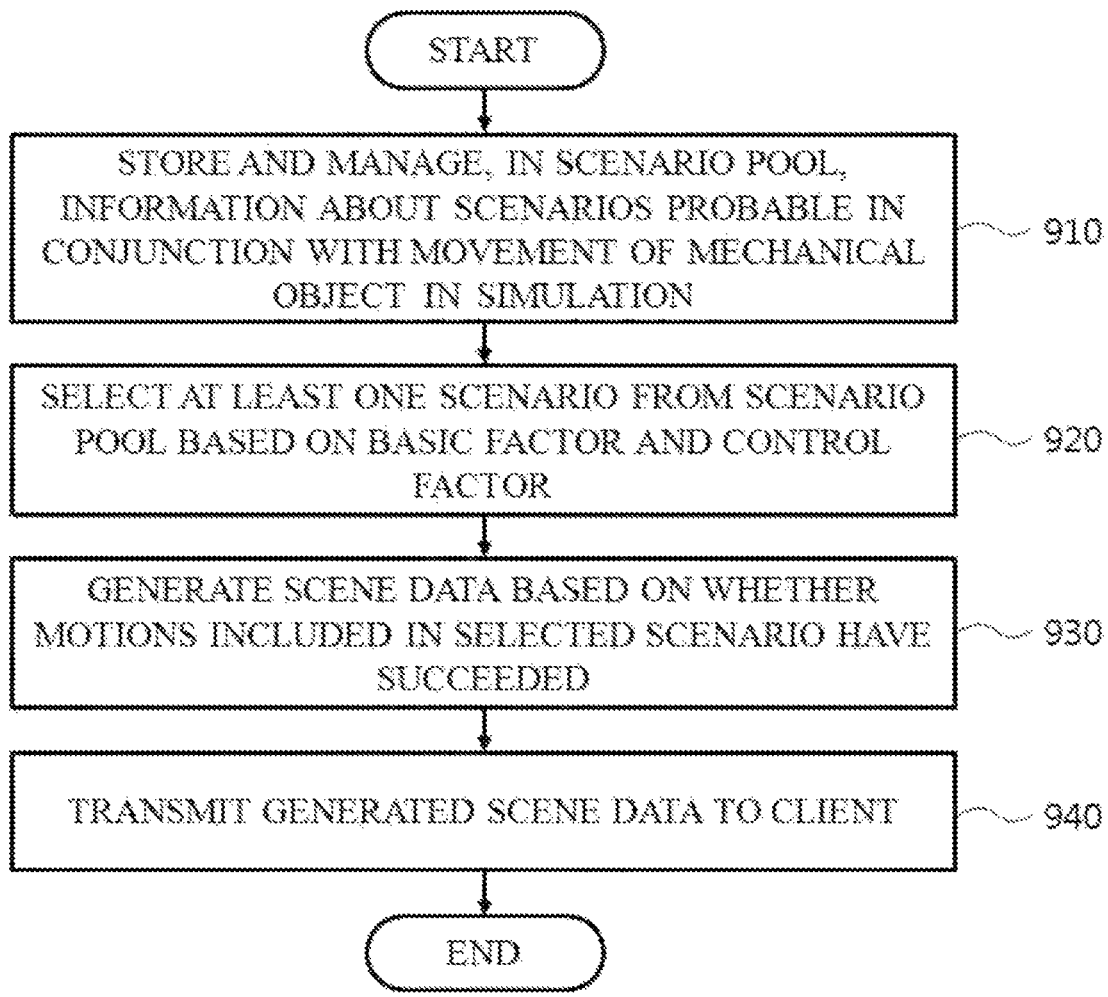
FIG. 9 illustrates a simulation method performed by a simulation system according to exemplary embodiments of the present disclosure.

FIG. 9 illustrates a simulation method performed by a simulation system according to exemplary embodiments of the present disclosure. The simulation method may be performed by the simulation system 100 or a processor in the simulation system 100.

The simulation system 100 or the processor may store and manage, in a scenario pool, information about probable scenarios in conjunction with a movement of a mechanical object 310 in a simulation (910). For example, in a soccer game simulation, scenarios of probable motions during a soccer game may be generated and then, stored and managed in the scenario pool. The scenario pool may be a database stored in a storage unit, such as a memory.

The simulation system 100 or the processor may select at least one scenario from the scenario pool, based on a basic factor and a control factor (920). The basic factor may include information about a scenario start location for connection between two scenarios. In a case of simulating a soccer game, a location of a soccer ball at a point in time when one scenario ends may be compared to a start location of a subsequent scenario. Also, the control factor may include a factor for setting a strategy of a user. In the example of simulating the soccer game, the control factor may include setting values for at least one of the following:
Presence of flank or center attack;
Frequency of mid-range shooting;
Level of balance between attack and defense;
Type of pass in team (short or long);
Frequency of pass or dribble; and
Weight for each formation.

Each scenario may include path information regarding a movement of a mechanical object 310. A role of a character corresponding to a main entity and a type of movement may be defined in each set of movement information. The type of movement may include a motion of a character. In the example of simulating a soccer game, the mechanical object 310 may include a ball object and the motion may include at least one of a pass, dribble, interception, and shot that may be triggered using the ball object. As described above, an action, such as "success in pass", may occur in response to a success in a corresponding motion. The role of the character may be defined as a role in a formation. Examples of character roles include, for example, a striker (ST), a center mid-fielder (CM), a center back (CB), and a right wing (RW).

The simulation system 100 or the processor may generate scene data based on whether motions included in the selected scenario have succeeded (930). The scene data may include unit data about an action corresponding to a continuously successful motion among the motions included in the selected scenario.

For example, in the soccer game simulation, in an example in which a ball is intercepted in a left-midfield area, and settings such as a flank attack preference, an attack-oriented balance, a pass preference, a high pass frequency, a low mid-ranging shooting frequency, and a 4-4-2 formation are made, one scenario may be selected from among multiple scenarios starting in a midfield area. The simulation system 100 or the processor may assign a probability weight to each scenario selected based on settings of the user, and may then randomly select a scenario.

As an example, the following scenario may be assumed to have been selected.

A right midfielder (RM) breaks through a right wing of a soccer field with a dribble, and passes the ball to the center of the field to a striker, who shoots the ball by heading the ball (RM→RM-centering→ST—heading shoot→END).

The simulation system 100 or the processor may match a player defined per unit motion in the selected scenario with player information of a camp as follows.

CB(AAA), CM(BBB), ST(CCC), RM(DDD). For example, a player AAA may be a center back (CB). A player BBB may be a center midfielder (CM). A player CCC may be a striker (ST). A player DDD may be a right midfielder (RM).

A success probability of a motion may be calculated for each unit motion.

A first motion may refer to a character breaking through a right wing with a dribble, and a success of the first motion may be probabilistically determined by comparing abilities of player DDD to abilities of a defending player of an opposing camp. For example, abilities to be compared may be main strength, acceleration, quickness, and dribble speed.

When the motion (e.g., first motion) is determined to have succeeded, the motion moves to a subsequent motion. Conversely, when the motion (e.g., first motion) is determined to have failed, scene data including unit data of an action, such as "blocking a dribble," may be generated and a subsequent scenario, for example, a scenario of an opposing camp may proceed.

If the first motion succeeds, a success probability of a second motion of the selected scenario may be calculated. The second motion may refer to centering to ST (CCC), and a success of the second motion may be probabilistically determined by comparing abilities of the player DDD, abilities of a player CCC, and abilities of one or more defenders of an opposing camp. For example, abilities of the player DDD for crossing a ball, a visual field, a presence of mind, abilities of the player CCC for positioning, ball control, body balance, and a defending capability of the defender of the opposing camp may be used for comparison.

If the second motion fails, scene data including unit data about an "intercepted" action may be generated and a subsequent scenario, for example, a scenario of the opposing camp may proceed.

Conversely, if the second motion succeeds, a success probability of a third motion of the selected scenario may be calculated. The third motion may refer to a header of ST (CCC) and the success of the third motion may be probabilistically determined by comparing abilities of the player CCC, abilities of a defender of the opposing camp, and abilities of a goal keeper of the opposing camp. For example, abilities of the player CCC for shooting, goal decisiveness, heading, and presence of mind, a defending capability of the defender of the opposing camp, and abilities of the goalkeeper of the opposing camp for reflexes and ball handling may be used for comparison.

If the shooting motion succeeds, a game score may increase and a kickoff scenario of the opposing camp may be selected and proceeded with. Conversely, if the third motion fails, scene data including unit data about an "intercepted" action, and a "goalkeeper punching" action may be generated and a subsequent scenario, for example, a scenario of the opposing camp may proceed.

If a motion fails, a variety of actions such as a "line-out" action, a "side-out" action, a "defense foul" action, an "offense foul" action, and a "goalkeeper blocking" may occur in addition to the "intercepted" action and the "goalkeeper punching" action.

A predetermined amount of physical time, for example, ten seconds, may be allocated to each unit motion. A result of repeatedly configuring such a scenario until a game is over may be configured as a single soccer game simulation result.

As described above, scene data for an entire simulation may be generated prior to providing a simulation result. After at least one of a formation, a strategy, and a character is changed through a user interface, the terminal 110 may regenerate scene data after the change is made. Accordingly, a user may intervene in the simulation result.

The simulation system 100 or the processor may transmit the generated scene data to the terminal 110 (940). The terminal 110 may verify an action based on the scene data, and may display a movement of the mechanical object 310 made in response to the action using a line that connects a start location of the movement and an end location of the movement.

According to exemplary embodiments, although not illustrated, the simulation method of FIG. 9 may further include determining an occurrence of a highlight scene based on a probability that is preset based on a type of scene data, selecting scene data corresponding to the highlight scene from a highlight pool, and transmitting the selected scene data to the terminal 110 in response to the occurrence of the highlight scene. The highlight pool may directly include a variety of scene data, which differs from the scenario pool.

According to exemplary embodiments, the simulation system 100 may include a storage unit configured to store information about at least one of a location and abilities of each of the plurality of characters, a formation, abilities of each of camps into which the plurality of characters is grouped, a characteristic for each motion, and a strategy set by a user. A processor of the simulation system 100 may determine whether the motion has succeeded based on at least one set of the information.

According to exemplary embodiments, the processor may process the entire simulation prior to providing a simulation result. When at least one of a formation, a strategy, and a character is changed through a user interface, scene data may be regenerated after the change is made.

According to exemplary embodiments of the present disclosure, it is possible to minimize temporal constraints and spatial constraints by providing a web-based simulation, and to further effectively provide a simulation of a sports game and the like by simplifying a simulation representation. Also, it is possible to simplify a method of providing simulation information by displaying a movement of a mechanical object in response to an action of a character using a line, to simplify a simulation representation, and to provide a dynamic simulation representation for a highlight scene. Further, it is possible to increase the efficiency by generating and providing in advance scene data and result information for a simulation process, to receive an alteration of settings in the middle of a simulation, to regenerate scene data in response to the alteration, and to apply the altered settings to the simulation. It should be understood that while examples of a simulation have been provided with reference to a soccer game, the disclosed simulation method and system may apply to various suitable software and games, and is not limited to a soccer game.

It should also be understood that the simulation system 100 and the terminal 110 may be implemented using hardware components, software components, or a combination thereof. For example, a processor in the simulation system 100 or the terminal 110 may be implemented using one or more general-purpose or special purpose computers, such as, for example, a controller, an arithmetic logic unit, a digital signal processor, a microcomputer, a field programmable array, a programmable logic unit, a microprocessor or any other device capable of responding to and executing instructions and functions of the simulations described hereinabove. The processor may run an operating system (OS) and one or more software applications that run on the OS. The processor also may access, store, manipulate, process, and create data in response to execution of the software. For purpose of simplicity, the description of the processor is used as singular; however, one skilled in the art will be appreciated that multiple processors may be used. In addition, different processing configurations are possible, such as parallel processors.

The software may include a computer program, a piece of code, an instruction, or some combination thereof, for independently or collectively instructing or configuring the processor to operate as desired. Software and data may be embodied permanently or temporarily in any type of machine, component, physical or virtual equipment, computer-readable storage medium or device capable of providing instructions or data to or being interpreted by the processor. The software also may be distributed over network-coupled computer systems so that the software is stored and executed in a distributed fashion. In particular, the software and data may be stored by one or more computer-readable recording mediums.

The exemplary embodiments according to the present disclosure may be recorded in non-transitory computer-readable media including program instructions to implement various operations embodied by a computer. The media may also include, alone or in combination with the program instructions, data files, data structures, and the like. The media and program instructions may be those specially designed and constructed for the purposes of the disclosed subject matter, or they may be of the kind well-known and available to those having skill in the computer software arts. Examples of non-transitory computer-readable media include magnetic media such as hard disks, floppy disks, and magnetic tape; optical media such as CD ROM disks and DVD; magneto-optical media such as floptical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present disclosure.

It will be apparent to those skilled in the art that various modifications and variations can be made in the present disclosure without departing from the spirit or scope of the disclosed subject matter. Thus, it is intended that the present disclosure cover the modifications and variations of the disclosed subject matter provided they come within the scope of the appended claims and their equivalents.

What is claimed is:

1. A method comprising:
   determining, by a processor to simulate gameplay of a match in a management game as the match progresses, a real-time action for a mechanical object as part of a continuous sequence of actions by a camp in control of the mechanical object, the continuous sequence of actions comprising the real-time action extending from at least one previous action;
   displaying, in response to determining the real-time action, a real-time movement of the mechanical object using a line connecting a start location of the real-time movement extending from at least one other line depicting the at least one previous action and an end location of the real-time movement; and
   determining whether a highlight scene occurred based on a probability of each scene comprising a plurality of actions,
   wherein, in response to occurrence of the highlight scene, displaying the real-time movement comprises, instead of using the line, displaying a real-time movement of character objects for a plurality of characters and a real-time movement of the mechanical object, and wherein:
   at least one of a linetype pattern of the line and a thickness of the line is determined based on the real-time action; and
   a color of the line is determined based on the camp such that each joined line depicting the continuous sequence of actions is of a same color.

2. The method of claim 1, further comprising:
   determining a probability of success for each action among a pool of actions,
   wherein the real-time action for the mechanical object is randomly determined, by the processor, from among the pool of actions.

3. The method of claim 1, wherein:
   the method further comprises terminating, in response to another action breaking continuity of the continuous sequence of actions, display of joined lines depicting the continuous sequence of actions; and
   a color of another line depicting the another action is different from the color of the line.

4. The method of claim 1, wherein the real-time action for the mechanical object occurs in real-time for the simulation of the gameplay in response to a motion triggered by at least one character among a plurality of characters with respect to the mechanical object.

5. The method of claim 4, wherein:
   the mechanical object comprises a ball object; and
   the motion comprises at least one of a pass, a dribble, an interception, and a shot triggered by the at least one character with respect to the ball object.

6. The method of claim 4, wherein a success of the motion is determined based on at least one of a location of each of the plurality of characters, abilities of each of the plurality of characters, a formation, abilities of each camp into which the plurality of characters is grouped, a characteristic for each motion, and a strategy set by a user.

7. The method of claim 1, wherein displaying the real-time movement comprises displaying at least one of identification (ID) information of a character in control of the mechanical object and ID information of the real-time action in conjunction with the line or the mechanical object.

8. The method of claim 1, wherein determining the real-time action for the mechanical object comprises:
   receiving, from a simulation server, scene data comprising at least one set of unit data; and
   verifying the real-time action in the at least one set of unit data.

9. The method of claim 8, wherein:
   the unit data comprises information about a real-time action occurring due to one of a plurality of characters grouped into a plurality of camps, a real-time action occurring between two characters grouped into the same camp, or a real-time action occurring between two characters grouped into different camps; and
   the scene data comprises unit data of at least one real-time action continuously occurring due to characters grouped in the same camp.

10. The method of claim 8, wherein:
    scene data for entire simulation of the gameplay of the match is generated prior to providing a simulation result; and
    the method further comprises:
    providing a user interface for changing, during the gameplay, at least one of a formation, a strategy, and a character; and
    regenerating, in response to receiving a change via the user interface, a portion of the scene data based on the change, the portion of the scene data to occur in the simulation after the change.

11. A non-transitory computer-readable storage medium to store a program to implement the method of claim 1.

12. A method of simulating gameplay, the method comprising:
- storing information about probable scenarios in conjunction with a movement of a mechanical object in a simulation of gameplay of a match in a management game, each probable scenario among the probable scenarios comprising predetermined motions of the mechanical object;
- selecting, via a processor as the gameplay processes, a scenario from the probable scenarios to simulate a portion of the gameplay;
- generating scene data based on whether predetermined motions in the selected scenario have succeeded, the scene data comprising a representation of a real-time movement of the mechanical object using a line connecting a start location of the real-time movement and an end location of the real-time movement; and
- transmitting the scene data to a terminal,
- wherein the scene data comprises unit data of each of real-time actions corresponding to continuously successful motions for the movement of the mechanical objection by one camp among the predetermined motions in the selected scenario, and
- wherein:
  - at least one of a linetype pattern of the line and a thickness of the line represents a type of the real-time action; and
  - a color of the line represents a camp in control of the mechanical object such that each joined line representing the continuously successful motion is of a same color.

13. The method of claim 12, wherein selecting the scenario comprises selecting the scenario based on:
- a basic factor comprising information about a scenario start location for connection between selected scenarios; and
- a control factor comprising a factor for setting a strategy of a user.

14. The method of claim 12, wherein the predetermined motions are triggered by characters grouped into a same camp.

15. The method of claim 12, further comprising:
- verifying a real-time action based on the scene data; and
- displaying, on a screen to simulate the portion of the gameplay as the gameplay progresses, the real-time movement of the mechanical object in response to the verified real-time action using the line that connects the start location of the real-time movement extending from at least one other line depicting the at least one previous action and an end location of the real-time movement.

16. The method of claim 15, further comprising:
- determining an occurrence of a highlight scene based on a probability set for a type of the scene data; and
- selecting scene data corresponding to the highlight scene from a highlight pool and transmitting the selected scene data to the terminal, in response to determining the occurrence of the highlight scene.

17. The method of claim 16, wherein, in response to determining the occurrence of the highlight scene, displaying, on a screen of the terminal to simulate the portion of the gameplay as the gameplay processes, a real-time movement of character objects for a plurality of characters grouped into a plurality of camps and a real-time movement of the mechanical object, based on the scene data selected from the highlight pool, instead of using the line.

18. A system to simulate gameplay of a match in a management game, the system comprising:
- a transceiver; and
- a processor to transmit, to a terminal via the transceiver, information about a real-time action for a mechanical object for simulation of a portion of the gameplay, the real-time action being an extension of at least one previous action, the real-time action and the at least one previous action forming a continuous sequence of actions by a camp in control of the mechanical object,
- wherein the terminal is configured to:
  - verify the real-time action using the information;
  - display, in response to verification of the real-time action, a real-time movement of the mechanical object using a line connecting a start location of the real-time movement extending from at least one other line depicting the at least one previous action and an end location of the real-time movement; and
  - determine whether a highlight scene occurred based on a probability of each scene comprising a plurality of actions,
- wherein, in response to occurrence of the highlight scene, display of the real-time movement comprises, instead of using the line, display of a real-time movement of character objects for a plurality of characters and a real-time movement of the mechanical objection, and
- wherein:
  - an aspect of the real-time action is displayed via at least one of a linetype pattern of the line and a thickness of the line; and
  - a color of the line is determined based on the camp such that each joined line depicting the continuous sequence of actions is of a same color.

19. The simulation system of claim 18, wherein the linetype pattern and the thickness of the line are determined based on the real-time action.

* * * * *